(12) United States Patent
Momota

(10) Patent No.: US 8,309,409 B2
(45) Date of Patent: Nov. 13, 2012

(54) METHOD FOR FABRICATING TRENCH GATE TO PREVENT ON VOLTAGE PARASETIC INFLUENCES

(75) Inventor: Seiji Momota, Nagano (JP)

(73) Assignee: Fuji Electric Co., Ltd., Kawasaki-shi (JP)

( * ) Notice: Subject to any disclaimer, the term of this patent is extended or adjusted under 35 U.S.C. 154(b) by 0 days.

(21) Appl. No.: 13/027,761

(22) Filed: Feb. 15, 2011

(65) Prior Publication Data

US 2011/0207296 A1    Aug. 25, 2011

(30) Foreign Application Priority Data

Feb. 23, 2010    (JP) .................................. 2010-037520

(51) Int. Cl.
*H01L 21/338* (2006.01)
*H01L 29/94* (2006.01)

(52) U.S. Cl. ........ 438/173; 438/259; 438/270; 438/700; 257/330; 257/621; 257/E29.189; 257/E29.257

(58) Field of Classification Search ........................ None
See application file for complete search history.

(56) References Cited

U.S. PATENT DOCUMENTS

| 6,987,305 | B2 * | 1/2006 | He et al. ........................ 257/417 |
| 7,851,349 | B2 * | 12/2010 | Rieger et al. ................... 438/620 |
| 2005/0253190 | A1 * | 11/2005 | Okumura et al. ............. 257/330 |
| 2010/0200914 | A1 * | 8/2010 | Hamada ........................ 257/330 |
| 2011/0108911 | A1 * | 5/2011 | Matsuoka ...................... 257/330 |
| 2011/0136310 | A1 * | 6/2011 | Grivna ............................ 438/270 |
| 2011/0156137 | A1 * | 6/2011 | Ikura .............................. 257/330 |
| 2011/0233663 | A1 * | 9/2011 | Hamada et al. ................ 257/331 |
| 2011/0294289 | A1 * | 12/2011 | Reiger et al. .................. 438/653 |

FOREIGN PATENT DOCUMENTS

| JP | 2-083982 A | 3/1990 |
| JP | 5-275705 A | 10/1993 |
| JP | 3375274 B2 | 2/2003 |

OTHER PUBLICATIONS

Japanese Office Action dated Jan. No. 10, 2012, issued in corresponding Japanese Patemt Application No. 2010-037535.

* cited by examiner

*Primary Examiner* — Alonzo Chambliss
(74) *Attorney, Agent, or Firm* — Westerman, Hattori, Daniels & Adrian, LLP

(57) ABSTRACT

A semiconductor-device fabrication method includes forming a second semiconductor region of a second conductivity on a surface layer of a first semiconductor region of a first conductivity, the second semiconductor region having an impurity concentration higher than the first semiconductor region; forming a trench penetrating the second semiconductor region, to the first semiconductor region; embedding a first electrode inside the trench via an insulating film, at a height lower than a surface of the second semiconductor region; forming an interlayer insulating film inside the trench, covering the first electrode; leaving the interlayer insulating film on only a surface of the first electrode; removing the second semiconductor region such that the surface thereof is positioned lower than an interface between the first electrode and the interlayer insulating film; and forming a second electrode contacting the second semiconductor region and adjacent to the first electrode via the insulating film in the trench.

9 Claims, 3 Drawing Sheets third semiconductor region

METHOD FOR FABRICATING TRENCH GATE TO PREVENT ON VOLTAGE PARASETIC INFLUENCES

BACKGROUND OF THE INVENTION

1. Field of the Invention

The present invention relates to a fabrication method for a semiconductor device.

2. Description of the Related Art

For electric power converting apparatuses used in electric vehicles (EV), etc., the most widely used insulated gate semiconductor devices have lower power consumption and are easily driven in a voltage-controlled manner. Insulated gate semiconductor devices are known as an insulated gate field effect transistor (metal oxide semiconductor field effect transistor (MOSFET)), an insulated gate bipolar transistor (IGBT), etc.

In the present description and the accompanying drawings, "n" and "p" prefixes of layers and regions indicate that the majority of carriers is an electron and a hole, respectively. "+" and "−" appended to an "n" or a "p" indicate that the impurity concentration is higher and lower, respectively, than layers and regions without "+" and "−".

FIG. 6 is a cross-sectional view of a conventional semiconductor device. For example, MOSFET of a trench gate structure will be described as a conventional insulated gate semiconductor device. A p-type base region 102 is disposed on a surface of a semiconductor substrate forming an n$^-$-type drift region 101. A trench 103 is disposed penetrating the base region 102 and reaching the drift region 101. A gate electrode 105 is disposed inside the trench 103 via a gate insulating film 104. An n$^+$-type source region 106 is selectively disposed on a surface layer of the base region 102 so as to be in contact with the trench 103. A source electrode 108 contacts the base region 102 and the source region 106. The source electrode 108 is electrically insulated from the gate electrode 105 by an interlayer insulating film 107. A drain electrode 109 is disposed on the backside of the semiconductor substrate.

Such a semiconductor device operates as follows. The source electrode 108 is in a state of being connected to the ground or of having a negative voltage applied thereto. The drain electrode 109 is in a state of having a positive voltage applied thereto. If a voltage lower than a threshold value is applied to the gate electrode 105, no current flows between the source and the drain since a p-n junction, made up of the base region 102 and the drift region 101, is inversely-biased. Therefore, the semiconductor device remains in the off-state. On the other hand, if a voltage exceeding the threshold value is applied to the gate electrode 105, in the p-type base region 102, a region in contact with the trench 103 beneath the source region 106 is inverted to become an n-type channel region. This causes an electron leaving the source electrode 108 to travel to the drain electrode 109 through an n-type region consisting of the channel region and the drift region 101 and current flows between the source and the drain, whereby the semiconductor device is turned on.

The following apparatus is proposed as such a semiconductor device. In a MOS control device including a first semiconductor region of a first conductivity type of a higher impurity density and having a first electrode formed on one principal surface side; a second semiconductor region of the first conductivity type and forming a first junction with the other principal surface side of the first semiconductor region; a third semiconductor region of a second conductivity type opposite of the first conductivity type that has one principal surface side forming a second junction with the second semiconductor region; and a region that has a second electrode formed on one principal surface side and that is adjacent to the other principal surface side of the third semiconductor region; the region adjacent to the other principal surface side of the third semiconductor region is a metal semiconductor alloy layer region that has an ohmic contact of an entire surface with the third semiconductor region formed by infiltrating a metal having a work function increasing an injected carrier amount into the third semiconductor region, and the MOS control device has a configuration with a MOS gate structure and a gate electrode formed so as to extend from the metal semiconductor alloy layer region through the third semiconductor region to the second semiconductor region to transport a carrier from the metal semiconductor alloy layer region to the second semiconductor region by forming an inversion layer on a surface of the third semiconductor region immediately under the MOS gate. Such a configuration is applicable to a device of a trench structure (see, e.g., Japanese Laid-open Patent Publication No. 3375274).

A method of fabricating the conventional insulated gate semiconductor device depicted in FIG. 6 will be described. The p-type base region 102 is first formed on the surface of the semiconductor substrate forming the n$^-$-type drift region 101. The trench 103 is then formed that penetrates the base region 102 and reaches the drift region 101. The gate electrode 105 is formed inside the trench 103 via the gate insulating film 104. The n$^+$-type source region 106 is selectively formed on the surface layer of the base region 102 so as to be in contact with the trench 103. The interlayer insulating film 107 is selectively formed on the surface of the semiconductor substrate to cover a surface of the gate electrode 105. The source electrode 108 is formed that contacts the base region 102 and the source region 106 exposed on the surface of the semiconductor substrate. The drain electrode 109 in contact with the drift region 101 is formed on the backside of the semiconductor substrate. This completes the MOSFET of the trench gate structure depicted in FIG. 6.

However, in conventional insulated gate semiconductor devices such as MOSFET and IGBT, a parasitic element such as a parasitic bipolar transistor and a parasitic thyristor is incidentally formed in addition to original constituent elements of the semiconductor devices. Such a parasitic element is likely to operate during abnormal times such as when an overcurrent flows in the semiconductor devices. It is problematic that the operation of the parasitic element adversely affects the operation of the original semiconductor devices.

For example, in the semiconductor device depicted in FIG. 6, a parasitic bipolar transistor 121 is formed that is made up of the drift region 101, the base region 102, and the source region 106. If an abnormal current such as overcurrent flows in the semiconductor device and a voltage drop in a channel region exceeds a forward voltage of a silicon diode, which is 0.7 V (because a built-in voltage of the diode is 0.6 V), the parasitic bipolar transistor 121 operates causing latch-up and short circuit. The operation of the parasitic bipolar transistor 121 cannot be controlled by controlling the voltage applied to the gate electrode 105. Therefore, destruction may occur if the semiconductor device exceeds a safe operation range.

A method that avoids such a problem is known where size reduction is achieved by forming the source region 106 to have a narrower width, for example. However, the current density in a semiconductor device fabricated in this way is increased by the size reduction and the parasitic bipolar transistor 121 becomes more likely to operate. Another method is known where the base region 102 is formed with a higher impurity concentration. However, a semiconductor device fabricated in this way becomes unable to sufficiently invert the channel region in the on-state. Therefore, the on-voltage problematically increases. Such a problem also occurs in IGBT of the trench gate structure.

To solve the problems of the conventional technologies described above, an object of the present invention is to provide a method of fabricating a semiconductor device capable of eliminating the influences of a parasitic element having a drift region, a base region, and a source/emitter region. Another object of the present invention is to provide a method of fabricating a semiconductor device capable of preventing the on-voltage from increasing.

SUMMARY OF THE INVENTION

It is an object of the present invention to at least solve the above problems in the conventional technologies.

According to one aspect of the invention, a method of fabricating a semiconductor device includes forming a second semiconductor region of a second conductivity type on a surface layer of a first semiconductor region of a first conductivity type, the second semiconductor region having an impurity concentration higher than that of the first semiconductor region; forming a trench that penetrates the second semiconductor region to reach the first semiconductor region; embedding a first electrode inside the trench via an insulating film, the first electrode not reaching the same height as a surface of the second semiconductor region; forming an interlayer insulating film embedded inside the trench to cover the first electrode; leaving the interlayer insulating film on only a surface of the first electrode; removing the second semiconductor region such that the surface of the second semiconductor region is positioned lower than an interface between the first electrode and the interlayer insulating film; and forming a second electrode that contacts the second semiconductor region, the second electrode being adjacent to the first electrode via the insulating film formed on a sidewall of the trench.

The other objects, features, and advantages of the present invention are specifically set forth in or will become apparent from the following detailed description of the invention when read in conjunction with the accompanying drawings.

DETAILED DESCRIPTION OF THE PREFERRED EMBODIMENTS

Figure 1:
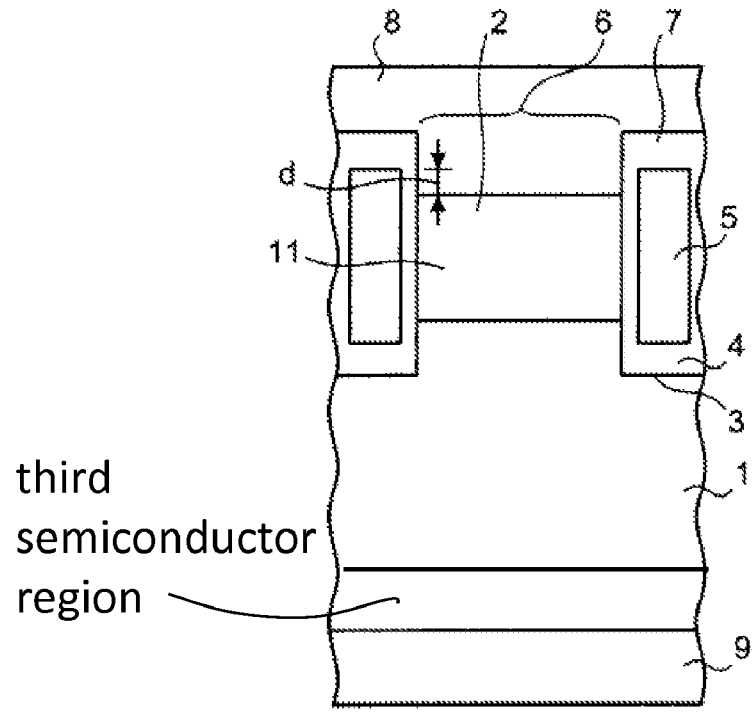
FIG. 1 is a cross-sectional view of a semiconductor device according to the embodiment.

Referring to the accompanying drawings, exemplary embodiments according to the present invention are explained in detail below. With respect to the embodiments and drawings, like components are given the same reference numerals and redundant explanations are omitted.

FIG. 1 is a cross-sectional view of a semiconductor device according to the embodiment. The semiconductor device depicted in FIG. 1 has a p-type (second-conductivity-type) base region 2 disposed on a surface layer of a semiconductor substrate forming an n$^-$-type (first-conductivity-type) drift region 1. The base region 2 has an impurity concentration that is higher than that of the drift region 1. On a front surface of the semiconductor substrate, a trench structure made up of a trench 3 that penetrates the base region 2 to reach the drift region 1 is disposed. The drift region 1 corresponds to a first semiconductor region. The base region 2 corresponds to a second semiconductor region.

A gate electrode 5 is disposed inside the trench 3 via a gate insulating film 4. The gate insulating film 4 and the gate electrode 5 projects beyond a surface of the base region 2 on the front surface side of the semiconductor substrate, whereby a first recess portion 6 is configured by the gate insulating film 4 forming a sidewall and disposed substantially perpendicular to the front surface of the semiconductor substrate along a sidewall of the trench 3 and by the base region 2 forming a bottom surface and disposed between adjacent trenches 3 to have a surface substantially parallel to the front surface of the semiconductor substrate. The surface of the gate electrode 5 is covered by an interlayer insulating film 7. The gate insulating film 4 corresponds to an insulating film. The gate electrode 5 corresponds to a first electrode. The first recess portion 6 corresponds to a recess portion.

A source electrode 8 is embedded inside the first recess portion 6. The source electrode 8 is disposed so as to be in contact with the base region 2 and to be adjacent to the gate electrode 5 via the gate insulating film 4 disposed to project from the surface of the base region 2 on the front surface side. The source electrode 8 is electrically insulated from the gate electrode 5 by the interlayer insulating film 7. The source electrode 8 corresponds to a second electrode. A drain electrode 9 is disposed on the backside of the drift region 1.

The bottom surface of the first recess portion 6, i.e., an interface between the base region 2 and the source electrode 8 (hereinafter, an upper end of the base region 2) is positioned closer to the backside of the drift region 1 than an interface between the gate electrode 5 and the interlayer insulating film 7 (hereinafter, an upper end of the gate electrode 5). Since the source electrode 8 disposed in the first recess portion 6 is adjacent to the gate electrode 5 via the gate insulating film 4, a channel region 11 is formed in the base region 2. The channel region 11 is a region of the base region 2 adjacent to the gate electrode 5 via the gate insulating film 4.

A distance d from the upper end of the base region 2 to the upper end of the gate electrode 5 is desirably equal to or greater than 0.05 μm and equal to or less than 2 μm. The reason is as follows. If the distance d is less than 0.05 μm, the source electrode 8 disposed in the first recess portion 6 is located adjacently to the gate electrode 5 via the gate insulating film 4 for a shorter distance. Therefore, the operation of the semiconductor device becomes unstable. In contrast, if the distance d is deepened to 2 μm, the operation of the device becomes stable since the gate electrode 5 and the source electrode 6 face each other via the gate insulating film 4 over an entire region.

Figure 2:
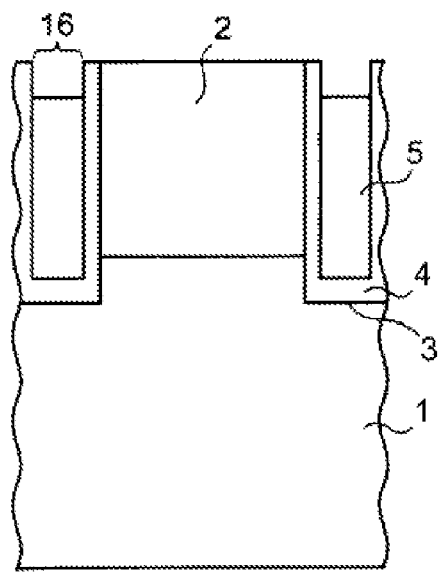
FIGS. 2 to 5 are cross-sectional views of a semiconductor device and depict a fabrication method according to the embodiment.

A method of fabricating such a semiconductor device will be described. FIGS. 2 to 5 are cross-sectional views of a semiconductor device and depict a fabrication method according to the embodiment. First, as depicted in FIG. 2, the p-type base region 2 is formed, by ion implantation of boron (B), for example, on the surface layer of the semiconductor substrate forming the n$^-$-type drift region 1. The base region 2 is formed having an impurity concentration higher than that of the drift region 1. For example, photolithography is used for forming the trench 3 that penetrates the base region 2 to reach the drift region 1.

The gate insulating film 4 made up of a thin silicon dioxide film ($SiO_2$) and formed on the sidewall and the bottom surface of the trench 3 by a thermal oxidation method, for example. The gate electrode 5 is formed inside the trench 3 through the gate insulating film 4 by embedding polysilicon (Poly-Si), for example. The gate electrode 5 is embedded so as not to reach the same height as the surface of the base region 2. Therefore, the surface of the gate electrode 5 is positioned lower than the surface of the base region 2. As a result, on the surface of the semiconductor substrate, a second recess portion 16 is formed by the gate electrode 5 forming a bottom surface and by the gate insulating film 4 forming a sidewall and formed on the sidewall of the trench 3.

Figure 3:
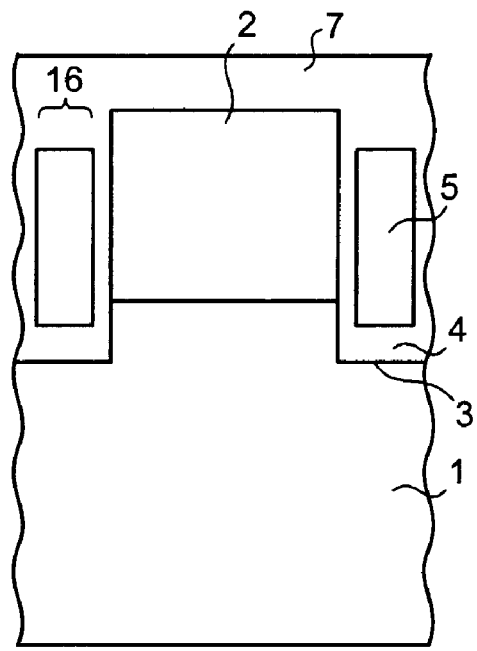

As depicted in FIG. 3, for example, a chemical vapor deposition (CVD) method is used for forming the interlayer insulating film 7 made up of, for example, a phosphosilicate glass (PSG) film on the surface of the semiconductor substrate. The interlayer insulating film 7 is formed to be embedded inside the second recess portion 16 to cover the surface of the gate electrode 5. By using a CVD method, the interlayer insulating film 7 is deposited substantially flatly on the entire surface of the semiconductor substrate without unevenness. Therefore, the interlayer insulating film 7 has a thickness increased by a depth of the second recess portion 16 at the portion formed on the second recess portion 16. Therefore, the portion of the interlayer insulating film 7 formed on the second recess portion 16 is formed thicker than the portion formed on the surface of the base region 2. The interlayer insulating film 7 may be formed by using not only the CVD method described above but also another method as long as the method is capable of forming the portion of the interlayer insulating film 7 formed on the second recess portion 16 with a thickness greater than that of the portion formed on the surface of the base region 2.

Figure 4:
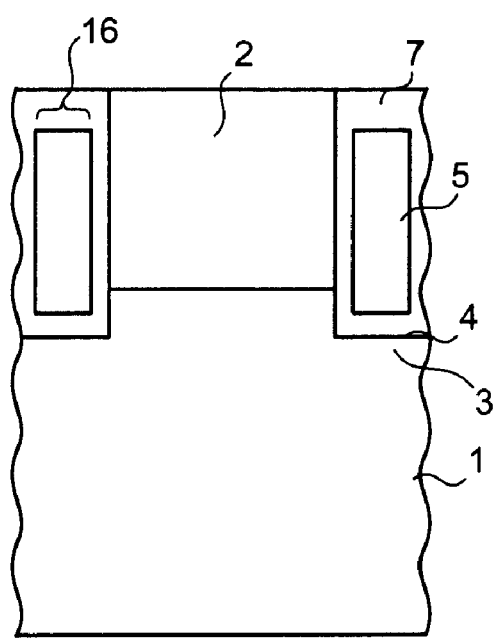

The etch-back is then performed to completely remove the interlayer insulating film 7 until the surface of the base region 2 is exposed. This etch-back completely removes the portion of the interlayer insulating film 7 formed on the surface of the base region 2. On the other hand, the portion of the interlayer insulating film 7 formed on the second recess portion 16 is not removed and remains having a thickness substantially equivalent to the depth of the second recess portion 16. Therefore, as depicted in FIG. 4, the interlayer insulating film 7 remains only on the surface of the gate electrode 5 within the second recess portion 16.

Figure 5:
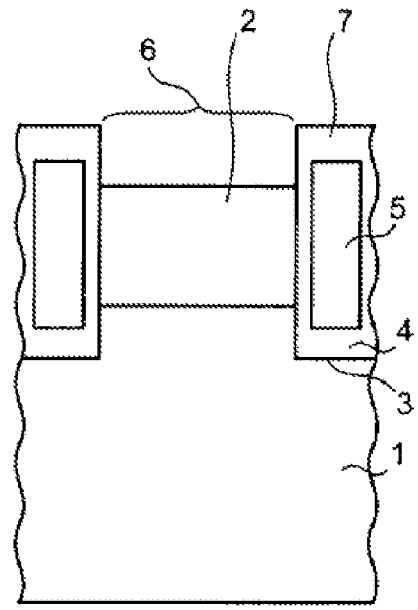

As depicted in FIG. 5, etching is performed to remove the surface layer of the base region 2 until the surface of the base region 2 (upper end of the base region 2) is positioned lower than the interface between the gate electrode 5 and the interlayer insulating film 7 (upper end of the gate electrode 5). An etching method and etching conditions of this etching process are selected such that a selection ratio of the base region 2 becomes high relative to the gate insulating film 4 and the interlayer insulating film 7. Therefore, the interlayer insulating film 7 and the gate insulating film 4 are not removed by the etching. As a result, on the surface of the semiconductor substrate, the first recess portion 6 is formed by the gate insulating film 4 forming a sidewall and disposed on the sidewall of the trench 3 and by the base region 2 forming a bottom surface.

It is preferable in the etching process depicted in FIG. 5 that the surface layer of the base region 2 is removed to a depth (distance d) that is equal to or greater than 0.05 μm and equal to or less than 2 μm from the upper end of the gate electrode 5 to the surface of the base region 2. The reason is as described above. The etching method may be selected for wet etching using a mixed acid or aqueous potassium hydroxide solution (KOH) containing hydrofluoric acid (HF) and nitric acid ($HNO_3$), for example, or dry etching using a plasma gas, for example.

As depicted in FIG. 1, the source electrode 8 is then embedded inside the first recess portion 6 through a plating method, for example. As a result, the source electrode 8 comes into contact with the base region 2 on the bottom surface of the first recess portion 6 and is located adjacent to the gate electrode 5 via the gate insulating film 4 on the sidewall of the first recess portion 6. The source electrode 8 may be formed by using a chemical vapor deposition method or a sputtering method instead of the plating method. Nickel (Ni), tungsten (W), aluminum (Al), etc., may be used as a metal material used for the source electrode 8.

The source electrode 8 may have a configuration in which multiple metal electrode layers are laid. In this case, the metal electrode layers forming the source electrode 8 may be laid with formation methods and metal materials variously changed. For example, a tungsten electrode layer may be laid by using the CVD method for the source electrode 8 embedded inside the first recess portion 6 and an aluminum electrode layer may subsequently be laid by using the sputtering method or the plating method for the source electrode 8 formed on the substrate surface. Preferably, at least the bottom metal electrode layer is formed as a tungsten electrode layer by using the CVD method. This enables a metal material of the source electrode 8 to be accurately embedded in corners, etc., of the bottom surface of the first recess portion 6. Therefore, for example, problems such as peeling of the source electrode 8 can be prevented.

The drain electrode 9 in contact with the drift region 1 is formed on the backside of the semiconductor substrate. This completes the MOSFET of the trench gate structure depicted in FIG. 1.

Figure 6:
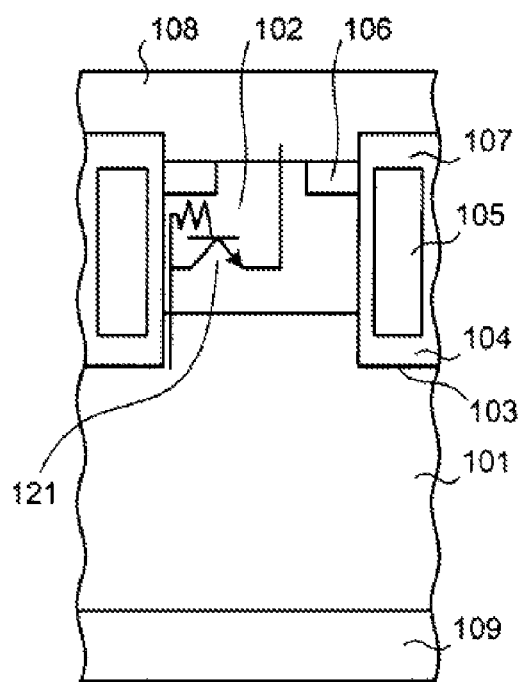
FIG. 6 is a cross-sectional view of a conventional semiconductor device.

As described above, according to the embodiment, the first recess portion 6 is formed and the source electrode 8 is embedded inside the first recess portion 6. Therefore, the channel region 11 is formed in the region of the base region 2 adjacent to the gate electrode 5 via the gate insulating film 4. This enables a semiconductor device operating in a conventional manner to be fabricated without forming a source region (the source region 106 of FIG. 6) on the surface layer of the base region 2. A parasitic bipolar transistor (parasitic element) consisting of the drift region 1, the base region 2, and the source region is not formed in the semiconductor device fabricated in this way. Therefore, the influences of the parasitic element consisting of the drift region 1, the base region 2, and the source region can be eliminated. As a result, the semiconductor device can be prevented from being destroyed when an abnormal current flows in the semiconductor device. Since the parasitic element consisting of the drift region 1, the base region 2, and the source region is not formed in the semiconductor device, even if the semiconductor device is reduced in size, problems arising when a conventional semiconductor device is reduced in size and consequent to the parasitic element consisting of the drift region 1, the base region 2, and the source region can be prevented. Since the parasitic element consisting of the drift region 1, the base region 2, and the source region is not formed, it is not necessary to increase the impurity concentration of the base region. As a result, the channel region 11 can be sufficiently inverted without increasing the on-voltage. Therefore, the on-voltage can be prevented from increasing. When the semiconductor device is fabricated, the interlayer insulating film 7 is formed by using the CVD method to embed the second recess portion 16 and the interlayer insulating film 7 is etched back. Therefore, the interlayer insulating film 7 can be left only on the surface of the gate electrode 5 without newly forming a mask, etc. The base region 2 is etched such that a selection ratio of the base region 2 becomes high relative to the gate insulating film 4 and the interlayer insulating film 7. Therefore, the surface layer of the base region 2 can be removed by a desired thickness to form the first recess portion 6 without newly forming a mask, etc.

In the embodiments described above, IGBT of the trench gate structure may be fabricated by forming a p-type collector region having an impurity concentration higher than a drift region, between the drift region and a backside electrode. A parasitic thyristor (parasitic element) consisting of the collector region, the drift region, the base region, and the emitter region is not formed in the semiconductor device fabricated in this way. Therefore, the same effects as the embodiments described above can be acquired. The backside electrode is a collector electrode. The collector electrode corresponds to a third electrode. The collector region corresponds to a third semiconductor region.

Although the present invention has been described with an example of a circuit having a configuration in which one semiconductor device is disposed on a semiconductor substrate, the present invention is applicable not only to the embodiments described above but also to an integrated circuit (IC) having a configuration in which two or more semiconductor devices are disposed on a single substrate. For example, in a complementary MOS (CMOS), a parasitic thyristor is not formed that links parasitic pnp and npn transistors formed by an n-type drift region, a p-type well region, an n-type source region of n-type MOSFET, and a p-type source region of p-type MOSFET. The n-type and the p-type of the regions of the semiconductor device may be configured to be entirely reversed.

As described above, the method of fabricating a semiconductor device according to the present invention is useful for fabricating high-power semiconductor devices and is particularly suitable for fabricating insulated gate semiconductor devices such as MOSFET and IGBT.

According to the invention described above, the surface layer of the second semiconductor region is removed until the surface of the second semiconductor region is positioned lower than the interface between the first electrode and the interlayer insulating layer. On the surface of the semiconductor substrate, the recess portion is formed which is made up of an insulating film disposed along the sidewall of the trench and the second semiconductor region. The second electrode is embedded within the recess portion so that the second electrode is in contact with the second semiconductor region and adjacent to the first electrode via the insulating film. Therefore, a channel region is formed in a region of the second semiconductor region adjacent to the first electrode via the insulating film. This enables a semiconductor device operating in a conventional manner to be fabricated without forming a source region on the surface layer of the second semiconductor region. A parasitic bipolar transistor (parasitic element) consisting of the first semiconductor region, the second semiconductor region, and the source region is not formed in a semiconductor device fabricated in this way.

According to the invention, the semiconductor device operating in a conventional manner can be fabricated without forming an emitter region on the surface layer of the second semiconductor region. A parasitic thyristor (parasitic element) consisting of the third semiconductor region, the first semiconductor region, the second semiconductor region, and the emitter region is not formed in the semiconductor device fabricated in this way.

According to the invention, since a parasitic element consisting of a drift region, a base region, and a source/emitter region is not formed in the semiconductor device, even if the semiconductor device is reduced in size, problems arising consequent to the parasitic element consisting of the drift region, the base region, and the source/emitter region can be prevented when a conventional semiconductor device is reduced in size. Since the parasitic element consisting of the drift region, the base region, and the source/emitter region is not formed, it is not necessary to increase the impurity concentration of the second semiconductor region. Therefore, the channel region can be inverted sufficiently without increasing the on-voltage.

A method of fabricating of a semiconductor element according to the present invention enables elimination of the influences of the parasitic element consisting of the drift region, the base region, and the source/emitter region. The method further enables the on-voltage to be prevented from increasing.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

This application is based upon and claims the benefit of priority of the prior Japanese Patent Application No. 2010-037520, filed on Feb. 23, 2010, the entire contents of which are incorporated herein by reference.

What is claimed is:

1. A method of fabricating a semiconductor device comprising:
   forming a second semiconductor region of a second conductivity type on a surface layer of a first semiconductor region of a first conductivity type, the second semiconductor region having an impurity concentration higher than that of the first semiconductor region;
   forming a trench that penetrates the second semiconductor region to reach the first semiconductor region;
   embedding a first electrode inside the trench via an insulating film, the first electrode not reaching the same height as a surface of the second semiconductor region;
   forming an interlayer insulating film embedded inside the trench to cover the first electrode;
   leaving the interlayer insulating film on only a surface of the first electrode;
   removing the second semiconductor region such that the surface of the second semiconductor region is positioned lower than an interface between the first electrode and the interlayer insulating film; and
   forming a second electrode that has a bottom surface that contacts the second semiconductor region and that has a side surface that contacts said insulating film, the second electrode being adjacent to the first electrode via the insulating film formed on a sidewall of the trench.

2. The method of fabricating a semiconductor device according to claim 1, further comprising:
   forming a third semiconductor region of the second conductivity type on a surface of the first semiconductor region, the third semiconductor region having an impurity concentration higher than that of the first semiconductor region; and
   forming a third electrode on a surface of the third semiconductor region.

3. A method of fabricating a semiconductor device comprising:
   forming a second semiconductor region of a second conductivity type on a surface layer of a first semiconductor region of a first conductivity type, the second semiconductor region having an impurity concentration higher than that of the first semiconductor region;

forming a trench that penetrates the second semiconductor region to reach the first semiconductor region;

embedding a first electrode inside the trench via an insulating film, the first electrode not reaching the same height as a surface of the second semiconductor region;

forming an interlayer insulating film embedded inside the trench to cover the first electrode;

leaving the interlayer insulating film on only a surface of the first electrode;

removing the second semiconductor region such that the surface of the second semiconductor region is positioned lower than an interface between the first electrode and the interlayer insulating film;

forming a second electrode that contacts the second semiconductor region, the second electrode being adjacent to the first electrode via the insulating film formed on a sidewall of the trench; and wherein the second electrode is embedded in a recess portion made up of the second semiconductor region and the insulating film formed on the sidewall of the trench.

4. The method of fabricating a semiconductor device according to claim 3, including forming said recess such as to be delineated by a substantially flat top surface of said second semiconductor region and the insulating film that forms a sidewall that is substantially perpendicular to said top surface of said second semiconductor region.

5. The method of fabricating a semiconductor device according to claim 4, including forming said substantially flat top surface of said second semiconductor region such as to be substantially parallel to a front surface of a semiconductor substrate of said semiconductor device.

6. The method of fabricating a semiconductor device according to claim 4, wherein said second electrode is in contact with said substantially flat top surface of said second semiconductor region and said sidewall of said insulating film, whereby forming a channel region in a region of the second semiconductor region adjacent to said first electrode via the insulating film enabling the semiconductor device to be fabricated without forming a source region on a surface layer of the second semiconductor region.

7. The method of fabricating a semiconductor device according to claim 4, wherein two or more of said semiconductor devices are disposed on a single substrate.

8. A method of fabricating a semiconductor device comprising:

forming a second semiconductor region of a second conductivity type on a surface layer of a first semiconductor region of a first conductivity type, the second semiconductor region having an impurity concentration higher than that of the first semiconductor region;

forming a trench that penetrates the second semiconductor region to reach the first semiconductor region;

embedding a first electrode inside the trench via an insulating film, the first electrode not reaching the same height as a surface of the second semiconductor region;

forming an interlayer insulating film embedded inside the trench to cover the first electrode;

leaving the interlayer insulating film on only a surface of the first electrode;

removing the second semiconductor region such that the surface of the second semiconductor region is positioned lower than an interface between the first electrode and the interlayer insulating film;

forming a second electrode that contacts the second semiconductor region, the second electrode being adjacent to the first electrode via the insulating film formed on a sidewall of the trench; and wherein the second semiconductor region is removed by etching using the interlayer insulating film as a mask.

9. A method of fabricating a semiconductor device comprising:

forming a second semiconductor region of a second conductivity type on a surface layer of a first semiconductor region of a first conductivity type, the second semiconductor region having an impurity concentration higher than that of the first semiconductor region;

forming a trench that penetrates the second semiconductor region to reach the first semiconductor region;

embedding a first electrode inside the trench via an insulating film, the first electrode not reaching the same height as a surface of the second semiconductor region;

forming an interlayer insulating film embedded inside the trench to cover the first electrode;

leaving the interlayer insulating film on only a surface of the first electrode;

removing the second semiconductor region such that the surface of the second semiconductor region is positioned lower than an interface between the first electrode and the interlayer insulating film;

forming a second electrode that contacts the second semiconductor region, the second electrode being adjacent to the first electrode via the insulating film formed on a sidewall of the trench; and wherein the second semiconductor region is removed to a depth that is equal to or greater than 0.05 μm and equal to or less than 2 μm from the interface between the first electrode and the interlayer insulating film to the surface of the second semiconductor region.

* * * * *